(12) United States Patent
Fichet

(10) Patent No.: US 11,139,434 B2
(45) Date of Patent: Oct. 5, 2021

(54) IMPROVING STABILITY OF THIN FILM TRANSISTORS

(71) Applicant: FLEXENABLE LIMITED, Cambridge (GB)

(72) Inventor: Guillaume Fichet, Cambridge (GB)

(73) Assignee: FLEXENBLE LIMITED, Cambridge (GB)

( * ) Notice: Subject to any disclaimer, the term of this patent is extended or adjusted under 35 U.S.C. 154(b) by 354 days.

(21) Appl. No.: 16/343,506

(22) PCT Filed: Oct. 19, 2017

(86) PCT No.: PCT/EP2017/076755
§ 371 (c)(1),
(2) Date: Apr. 19, 2019

(87) PCT Pub. No.: WO2018/073366
PCT Pub. Date: Apr. 26, 2018

(65) Prior Publication Data
US 2019/0267549 A1 Aug. 29, 2019

(30) Foreign Application Priority Data
Oct. 20, 2016 (GB) .................... 1617775

(51) Int. Cl.
| | |
|---|---|
| *H01L 21/77* | (2017.01) |
| *H01L 51/00* | (2006.01) |
| *B01D 53/26* | (2006.01) |
| *F26B 5/04* | (2006.01) |
| *H01L 27/28* | (2006.01) |
| *H01L 51/05* | (2006.01) |

(52) U.S. Cl.
CPC ........ *H01L 51/0025* (2013.01); *B01D 53/261* (2013.01); *F26B 5/045* (2013.01); *H01L 27/283* (2013.01); *H01L 51/0026* (2013.01); *H01L 51/0031* (2013.01); *H01L 51/0541* (2013.01); *B01D 2253/116* (2013.01); *H01L 51/0512* (2013.01)

(58) Field of Classification Search
CPC ............. H01L 2021/775; H01L 29/786; H01L 29/78654; H01L 27/283; H01L 27/286; H01L 27/3244; H01L 27/3223; H01L 27/3251; H01L 27/3258; H01L 27/3262; H01L 51/5296
See application file for complete search history.

(56) References Cited

U.S. PATENT DOCUMENTS

2003/0189216 A1* 10/2003 Kamatani ........... H01L 51/5012
257/98

* cited by examiner

*Primary Examiner* — Mohammad M Choudhry
(74) *Attorney, Agent, or Firm* — Sughrue Mion, PLLC

(57) ABSTRACT

A technique comprising: producing an unencapsulated stack of layers defining one or more electronic devices including an organic semiconductor element; and then subjecting the unencapsulated stack of layers to a water removal treatment in a vacuum oven in the presence of an external water adsorbent; wherein the water removal treatment comprises heating the unencapsulated stack of layers in the vacuum oven for a time period longer than a control time period at which a spike in oven pressure attributable to the release of water from the stack of layers would occur with heating under the same treatment conditions but without the water absorbing material.

13 Claims, 4 Drawing Sheets

IMPROVING STABILITY OF THIN FILM TRANSISTORS

CROSS REFERENCE TO RELATED APPLICATIONS

This application is a National Stage of International Application No. PCT/EP2017/076755 filed Oct. 19, 2017, claiming priority based on British Patent Application No. 1617775.0 filed Oct. 20, 2016.

Thin film transistors are typically defined by a stack of layers comprising conductor, semiconductor and dielectric materials. Some of the layers of the stack may be deposited in an environment of air comprising moisture and oxygen; and some production processes include a step of heating the stack in a vacuum oven before encapsulation, with the aim of first removing gaseous and volatile components including water from the stack.

The inventor for the present application has conducted research around this heating process, and has surprisingly found that some modifications to the heating process resulted in a surprising and dramatic improvement in the performance stability of the thin film transistors.

There is hereby provided a method comprising: producing an unencapsulated stack of layers defining one or more electronic devices including an organic semiconductor element; and then subjecting the unencapsulated stack of layers to a water removal treatment in a vacuum oven in the presence of an external water adsorbent; wherein the water removal treatment comprises heating the unencapsulated stack of layers in the vacuum oven for a time period longer than a control time period at which a spike in oven pressure attributable to the release of water from the stack of layers would occur with heating under the same treatment conditions but without the water absorbing material.

According to one embodiment, the method comprises heating the stack of layers in the vacuum oven for a time period at least 20 times as long as the control time period, and preferably at least as 30 times as long as the control time period.

According to one embodiment, the water removal treatment comprises heating the stack of layers in the vacuum oven whilst packed in the external water adsorbent.

According to one embodiment, the external water adsorbent has a water capacity at 25° C. (grams of water adsorbable per 100 grams of water adsorbent) and a relative humidity of 10% of 15 g or more.

According to one embodiment, the water absorbent is a molecular sieve material.

There is also hereby provided a method comprising: producing an unencapsulated stack of layers defining one or more transistor devices including an organic semiconductor channel; and then subjecting the unencapsulated stack of layers to a water removal treatment in a vacuum oven; wherein the water removal treatment comprises heating the unencapsulated stack of layers in the vacuum oven in the presence of a water adsorbent for a time sufficient to remove water to an extent that the one or more transistor devices exhibit, after encapsulation of the stack, a variation in gate voltage of less than 6% in a stress test in air involving maintaining the gate voltage at a level required to achieve a current of 2.5 µA through the organic semiconductor channel for 60 hours.

There is also hereby provided a method comprising: producing an unencapsulated stack of layers defining one or more transistor devices including an organic semiconductor channel; and then subjecting the unencapsulated stack of layers to a water removal treatment in a vacuum oven; wherein the water removal treatment comprises heating the unencapsulated stack of layers in the vacuum oven in the presence of a water adsorbent for a time sufficient to remove water to an extent that the one or more transistor devices exhibit, after encapsulation of the stack, a variation in forward current through the organic semiconductor channel of less than about 5% in a stress test involving operating the one or more transistor devices at a fixed gate voltage and a fixed source-drain voltage for 90 hours in air at 60° C.

According to one embodiment, the water removal treatment comprises heating the stack of layers in the vacuum oven whilst packed in the external water adsorbent.

According to one embodiment, the external water adsorbent has a water capacity at 25° C. (grams of water adsorbable per 100 grams of water adsorbent) and a relative humidity of 10% of 15 g or more.

According to one embodiment, the water absorbent material is a molecular sieve.

There is also hereby provided a method comprising: producing an unencapsulated stack of layers defining one or more electronic devices including an organic semiconductor element; packing the unencapsulated stack of layers in a water adsorbent material; and then heating the packed, unencapsulated stack of layers in a vacuum oven; after said heating, unpacking the encapsulated stack of layers from said water adsorbent material in an environment substantially free of moisture; and then, also in an environment substantially free of moisture, encapsulating the unencapsulated stack of layers against the ingress of moisture.

There is also hereby provided a stack of layers defining one or more transistor devices including an organic semiconductor channel; wherein the one or more transistor devices exhibit a variation in gate voltage of less than 6% in a stress test in air involving maintaining the gate voltage at a level required to achieve a current of 2.5 µA through the organic semiconductor channel for 60 hours.

There is also hereby provided a stack of layers defining one or more transistor devices including an organic semiconductor channel; wherein the one or more transistor devices exhibit a variation in forward current through the organic semiconductor channel of less than about 5% in a stress test involving operating the one or more transistor devices at a fixed gate voltage and a fixed source-drain voltage for 90 hours in air at 60° C.

There is also hereby provided a display or sensing device including a stack of layers according to claim 12 or claim 13.

In the context of the present application, an unencapsulated TFT stack indicates a stack without a moisture barrier film (such as a flexible ultra-high barrier film) on at least one side (top and/or bottom) of the stack. A typical moisture barrier film consists of a plastic film with a water vapor transmission rate (WVTR) value of no more than $1\times10^{-3}$ g/(m$^2$ day).

Embodiments of the present invention are described in detail hereunder, by way of example only, with reference to the accompanying drawings, in which.

Figure 1:
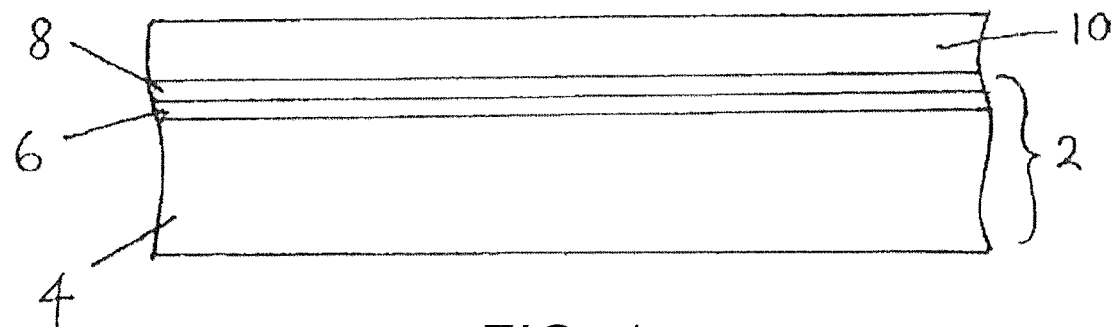
FIG. 1 shows a partial cross-sectional view of a TFT stack supported on a plastic support film before heating in a vacuum oven.
Figure 2:
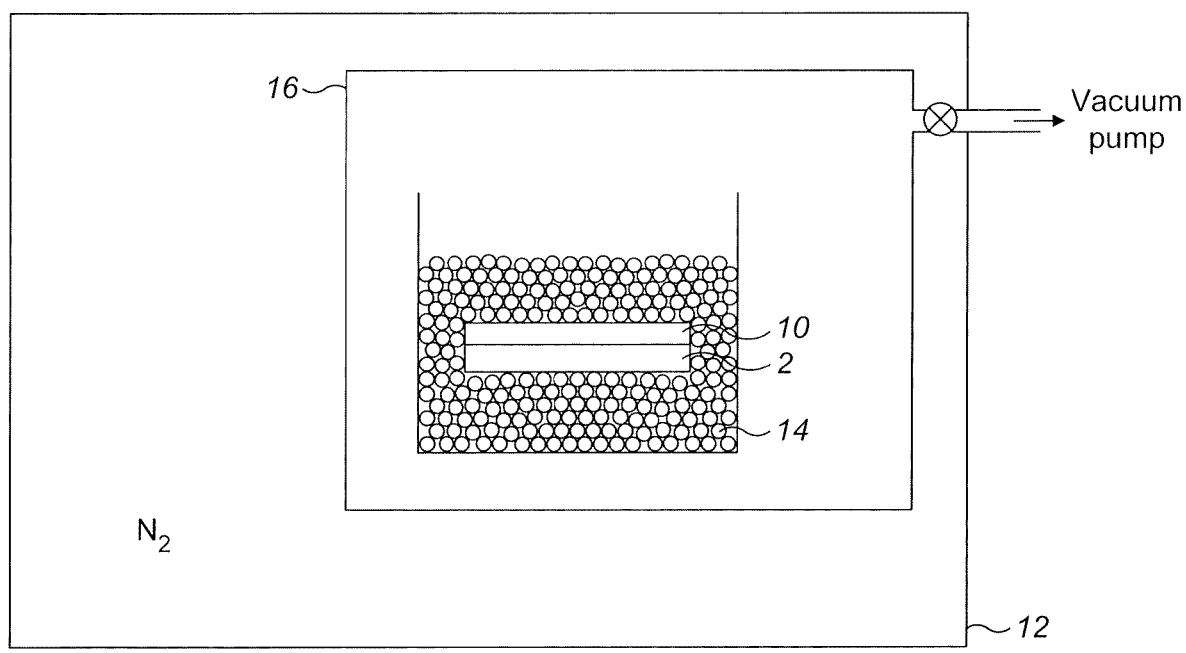
FIG. 2 shows the TFT stack of FIG. 1 packed in beads of water adsorbent material in a vacuum oven within a nitrogen glove box.
Figure 3:
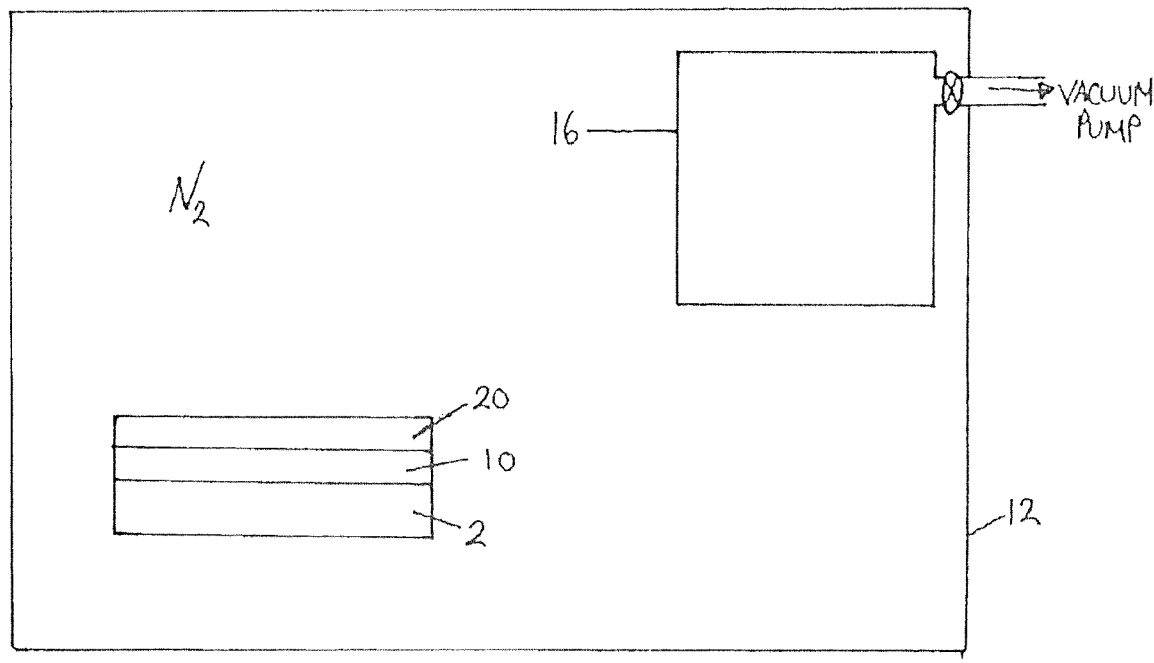
FIG. 3 shows the TFT stack of FIG. 2 removed from the vacuum oven and a barrier film applied to the top of the TFT stack within the nitrogen glove box to encapsulate the TFT stack between the barrier film and a barrier layer between the TFT stack and the plastic support film.
Figure 4:
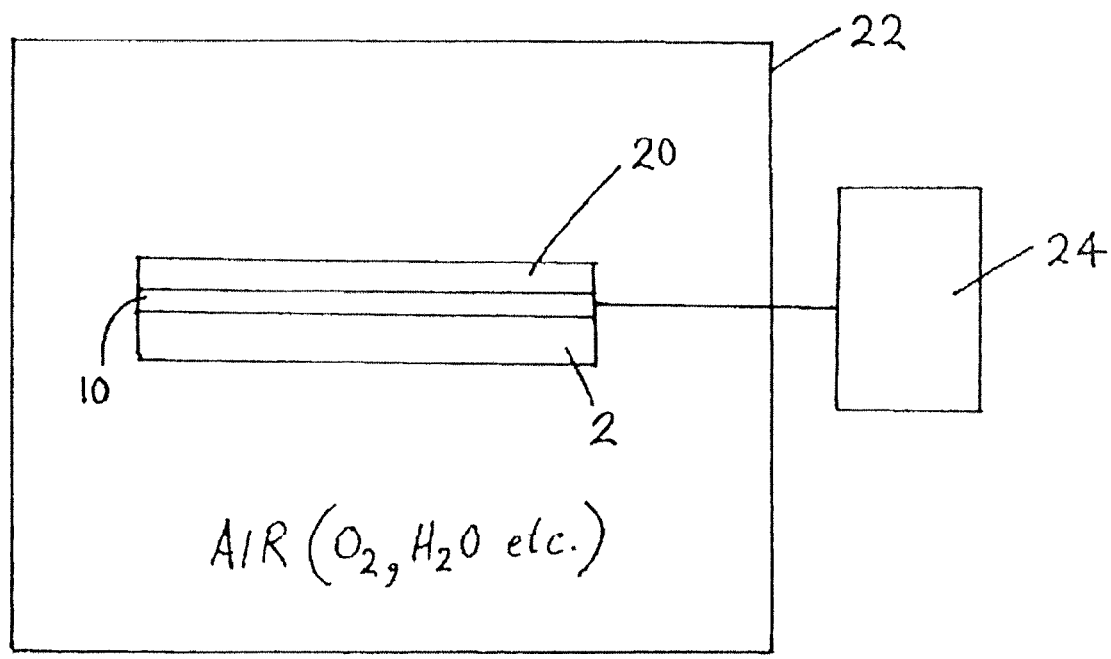
FIG. 4 shows the TFT stack of FIG. 3 removed from the nitrogen glove box and under test within an oven in an environment of air comprising moisture and oxygen.

In this example, a TFT stack 10 is supported on a flexible support 2 comprising a plastic polymer base film 4, an organic polymer planarization layer 6 coated onto the polymer base film, and an inorganic moisture barrier film 8 deposited by vapour deposition on the planarization layer 6. The TFT stack 10 comprises a stack of patterned layers of conductor, semiconductor and dielectric materials deposited over the nitride barrier film 8.

In this example, the conductor material(s) may comprise one or more metals, and the semiconductor and dielectric materials may comprise organic polymer materials. At least some of the layers of semiconductor and dielectric materials are deposited in an environment of air comprising moisture and oxygen, by which moisture and oxygen are unavoidably incorporated into the TFT stack 10.

Figure 5:
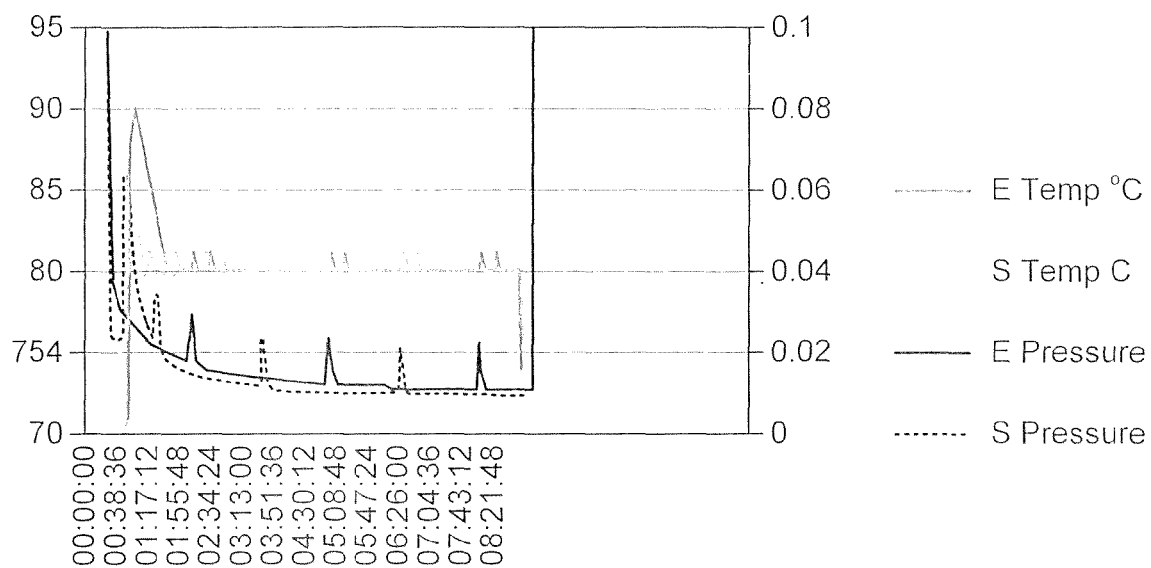
FIG. 5 shows a plot of vacuum oven pressure at 80° C. against time for both (a) a vacuum oven containing a TFT stack produced at least partially in an environment of air comprising moisture and oxygen, and (b) a vacuum oven containing no sample, as a control measurement.

The TFT stack 10 is then moved to a substantially pure nitrogen environment in a glove box 12, and completely immersed into a volume of molecular sieve beads 14. While keeping the TFT stack completely immersed in the volume of molecular sieve beads, the TFT stack 10 is moved to an oven 16 within the glove box 12. A vacuum pump is continuously operated to reduce the pressure in the oven 16, and a heater is controlled in response to a measurement of the temperature within the vacuum oven 16 to maintain the temperature within the oven at about 80° C. The TFT stack 10 immersed in the molecular sieve beads is maintained under these conditions for more than 48 hours. This time duration is more than 30 times the length of time at which a spike attributable to the removal of water from the TFT stack is observed when heating the TFT stack in the same vacuum oven 16 at the same temperature of 80° C. FIG. 5 shows the detection of a spike in vacuum oven pressure within the first 1.5 hours of the heating process, and the pressure detected thereafter is the same as that for a vacuum oven under the same operating conditions but not containing any TFT stack. The heating is continued for more than 30 times the period of time after which the measurements of pressure within the vacuum oven 16 indicate that all water has been removed from the TFT stack 10.

After the heating process is completed, the TFT stack 10 is taken out of the vacuum oven 16 within the nitrogen glove box 12, the TFT stack 10 is extracted from the volume of molecular sieve beads 14 under the environment of substantially pure nitrogen, and a polymer moisture barrier film 20 is applied by adhesive to the top of the TFT stack 10 to encapsulate the TFT stack 10 between the moisture barrier film 20 and the nitride layer 8 below the TFT stack 10, while the TFT stack 10 is within the environment of substantially pure nitrogen. Examples of suitable moisture barrier films are described in "Barrier Layers For Flexible Electronics 2016-2026: Technologies, Markets, Forecasts" authored by Dr. Harry Zervos and published by IDTechEx, whose entire content is incorporated herein by reference.

The encapsulated TFT stack is then removed from the nitrogen glove box, and subjected to testing within an oven 22 at a temperature of 60° C. in an environment of air containing moisture and oxygen. Electronics 24 outside the oven 22 are connected to the TFTs to drive the TFTs and detect changes in the performance of the TFTs.

Figure 6:
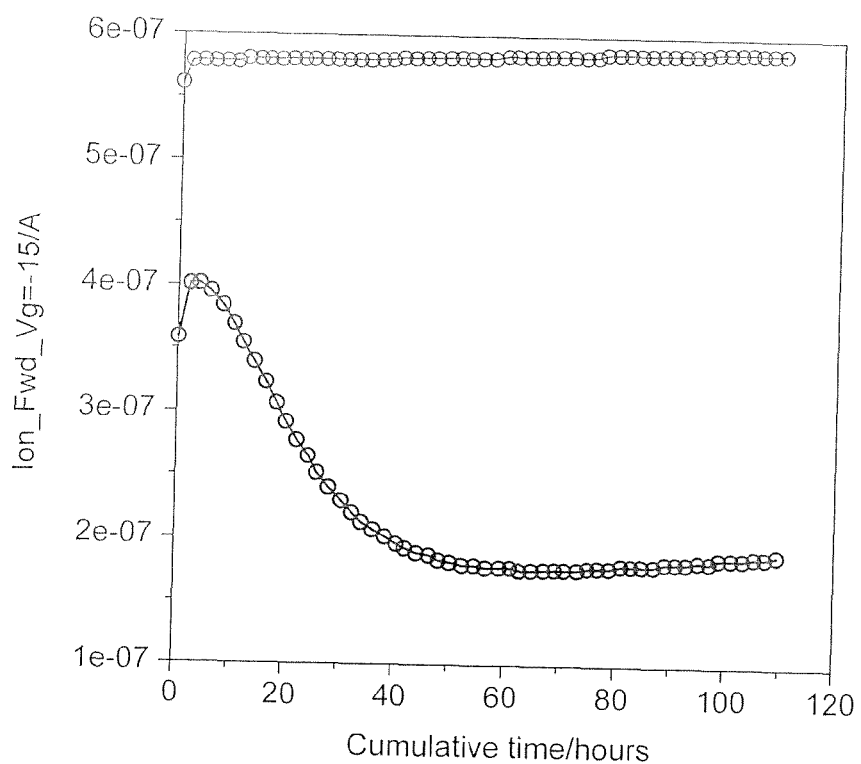
FIG. 6 shows a plot of forward current at a fixed "on" gate voltage at approx. 2 hours intervals during storage at 60° C. over a duration of more than 90 hours, for both (a) a TFT stack subject to a conventional heating process (lower line), and (b) a TFT stack subject to a heating process according to an embodiment of the present invention (upper line)

FIG. 6 shows the results of measuring the forward current of the TFTs defined by the TFT stack at a fixed gate voltage and a fixed source-drain voltage at approx. 2 hour intervals for a duration of more than 90 hours in an air environment at 60° C. The change in forward current over the duration of the test was found to be less than 5%, which is a dramatic improvement in stability compared to a TFT stack subjected to a conventional heating process without immersion in a volume of molecular sieve beads (lower line of FIG. 6), which exhibited a change in forward current under the same conditions of 50%.

Figure 7:
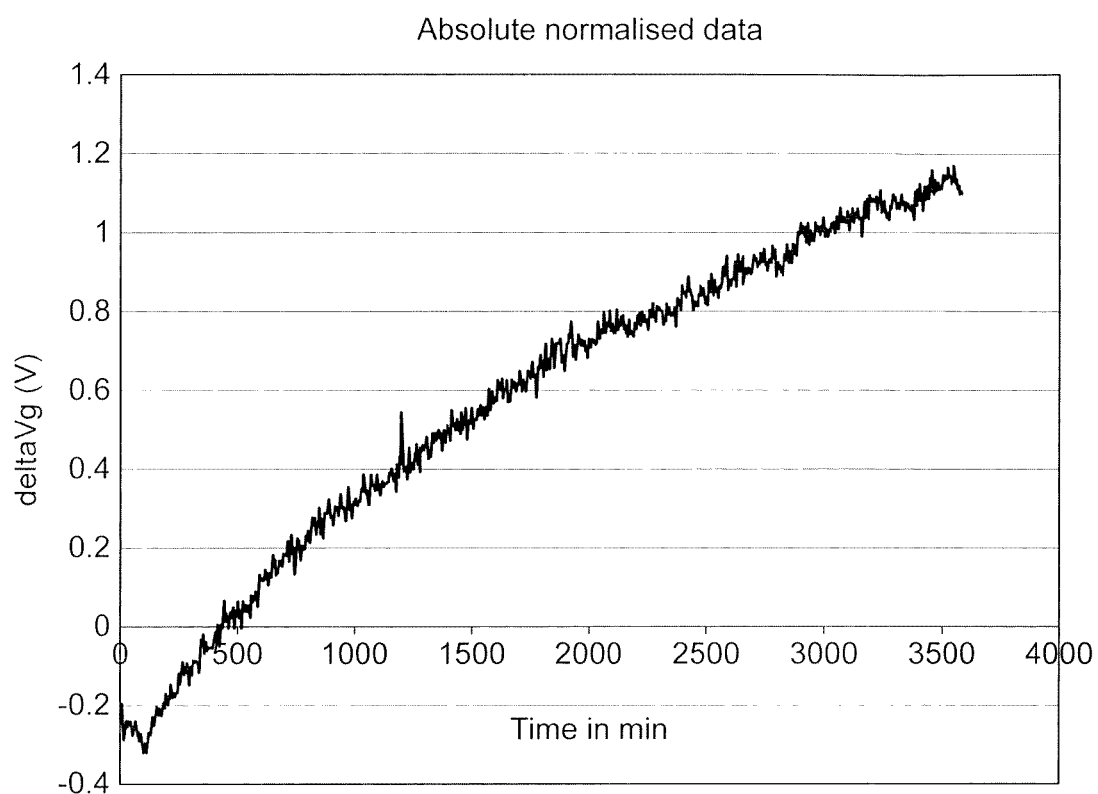
FIG. 7 shows the change in threshold voltage for a TFT stack processed according to an embodiment of the present invention during a constant current stress test involving controlling the gate voltage to achieve a current of 2.5 micro amps through the semiconductor channels of the TFTs for up to 60 hours.

FIG. 7 shows a plot of the gate voltage required to achieve a current of 2.5 μA through the organic semiconductor channel for 60 hours for a given voltage difference between the voltages applied to the source and drain electrodes of the TFTs. The variation in gate voltage over the 60 hour duration of the test was found to be less than 6%.

As mentioned above, active molecular sieve material was used as the water adsorbent in which the TFT stack was packed during the whole of the heating process. The molecular sieve material has a water capacity (grams of water adsorbable per 100 grams) of about 15 g or more at 25° C. and a relative humidity of 10%.

Figure 8:
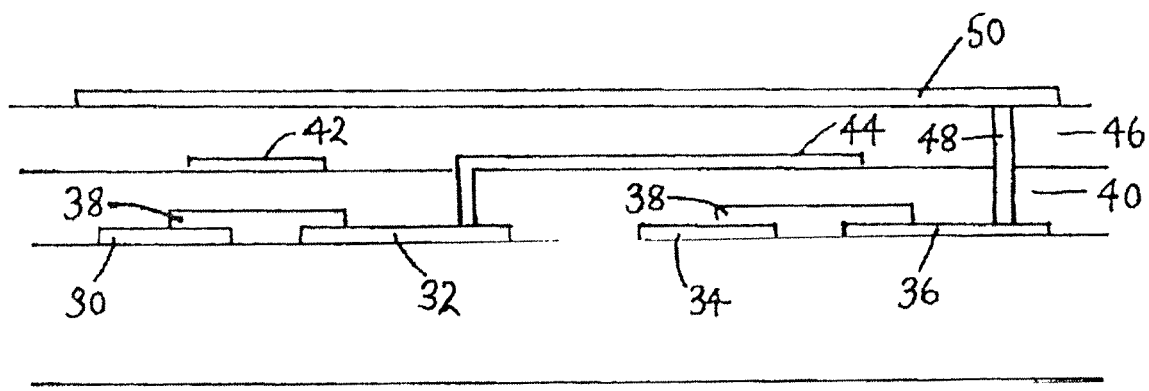
FIG. 8 is a cross-sectional illustration of an example of a TFT architecture defined by a stack of conductor, semiconductor and dielectric layers.

FIG. 8 shows an example of a switching circuitry architecture defined by a stack of conductor, semiconductor and dielectric/insulator layers. FIG. 8 shows a 2T1C architecture for a single display pixel, but for the example of 2T1C, a TFT stack will typically define a 2T1C architecture for a large array of pixels, including a respective combination of switching and drive transistors for each pixel. The TFT stack 10 may also define other switching circuitry architectures for e.g. display devices (including light-emitting diode, liquid crystal and electrophoretic display devices) and sensor devices.

With reference to FIG. 8, a patterned first conductor layer defines (i) the source and drain electrodes 30, 32 of a switching transistor, (ii) a source addressing line connected to the source electrode 30 of the switching transistor; (iii) source and drain electrodes 34, 36 of a drive transistor; and (iv) a power line connected to the source electrode of the drive transistor. A patterned, organic polymer semiconductor layer 38 defines the semiconductor channels of the switching and drive transistors. An organic polymer insulator layer 40 defines the gate dielectric of the switching and drive transistors. A patterned, second conductor layer defines the gate electrodes 42, 44 of the switching and drive transistors, and a gate addressing line connected to the gate electrode of the switching transistor. The part of the patterned, second conductor layer that defines the gate electrode 44 of the drive transistor contacts the part of the patterned first conductor layer that defines the drain electrode 32 of the switching transistor. A further organic polymer insulator layer 46 is formed over the patterned second conductor layer. A via hole 48 is formed in the further organic polymer insulator layer in the regions of the drain electrode of the drive transistor. A patterned third conductor layer defines a pixel electrode 50, which contacts the drain electrode of the drive transistor via said via-hole in the further organic polymer insulator layer.

In addition to any modifications explicitly mentioned above, it will be evident to a person skilled in the art that various other modifications of the described embodiment may be made within the scope of the invention.

The invention claimed is:

1. A method comprising: producing an unencapsulated stack of layers defining one or more electronic devices including an organic semiconductor element; and then subjecting the unencapsulated stack of layers to a water removal treatment in a vacuum oven in the presence of an external water adsorbent; wherein the water removal treatment comprises heating the unencapsulated stack of layers in the vacuum oven for a time period longer than a control time period at which a spike in oven pressure attributable to the release of water from the stack of layers would occur with heating under the same treatment conditions but without the water absorbing material.

2. The method according to claim 1 comprising heating the stack of layers in the vacuum oven for a time period at least 20 times as long as the control time period, and preferably at least as 30 times as long as the control time period.

3. The method according to claim 1, wherein the water removal treatment comprises heating the stack of layers in the vacuum oven whilst packed in the external water adsorbent.

4. The method according to claim 1, wherein the external water adsorbent has a water capacity at 25° C. (grams of water adsorbable per 100 grams of water adsorbent) and a relative humidity of 10% of 15 g or more.

5. The method according to claim 1, wherein the water absorbent is a molecular sieve material.

6. A method comprising: producing an unencapsulated stack of layers defining one or more transistor devices including an organic semiconductor channel; and then subjecting the unencapsulated stack of layers to a water removal treatment in a vacuum oven; wherein the water removal treatment comprises heating the unencapsulated stack of layers in the vacuum oven in the presence of a water adsorbent for a time sufficient to remove water to an extent that the one or more transistor devices exhibit, after encapsulation of the stack, a variation in gate voltage of less than 6% in a stress test in air involving maintaining the gate voltage at a level required to achieve a current of 2.5 µA through the organic semiconductor channel for 60 hours.

7. A method comprising: producing an unencapsulated stack of layers defining one or more transistor devices including an organic semiconductor channel; and then subjecting the unencapsulated stack of layers to a water removal treatment in a vacuum oven; wherein the water removal treatment comprises heating the unencapsulated stack of layers in the vacuum oven in the presence of a water adsorbent for a time sufficient to remove water to an extent that the one or more transistor devices exhibit, after encapsulation of the stack, a variation in forward current through the organic semiconductor channel of less than about 5% in a stress test involving operating the one or more transistor devices at a fixed gate voltage and a fixed source-drain voltage for 90 hours in air at 60° C.

8. The method according to claim 6, wherein the water removal treatment comprises heating the stack of layers in the vacuum oven whilst packed in the external water adsorbent.

9. The method according to claim 6, wherein the external water adsorbent has a water capacity at 25° C. (grams of water adsorbable per 100 grams of water adsorbent) and a relative humidity of 10% of 15 g or more.

10. The method according to claim 6, wherein the water absorbent material is a molecular sieve.

11. The method according to claim 7, wherein the water removal treatment comprises heating the stack of layers in the vacuum oven whilst packed in the external water adsorbent.

12. The method according to claim 7, wherein the external water adsorbent has a water capacity at 25° C. (grams of water adsorbable per 100 grams of water adsorbent) and a relative humidity of 10% of 15 g or more.

13. The method according to claim 7, wherein the water absorbent material is a molecular sieve.

* * * * *